United States Patent

Sasaki et al.

Patent Number: 5,424,730
Date of Patent: Jun. 13, 1995

[54] METHOD AND APPARATUS FOR DIFFERENTIATING SIMULTANEOUS AND SEQUENTIAL KEY STROKES

[75] Inventors: Kazuko Sasaki, Tokyo; Takashi Hazui, Moriguchi; Hitoshi Ebihara, Tokyo; Shuichi Sakaguchi, Yamato; Akira Kamakura, Kawasaki; Sadayoshi Sato, Kadoma, all of Japan

[73] Assignees: Fujitsu Limited; Matsushita Electric Industrial Co. Ltd.; Ascii Corp.; Sanyo Electric Co. Ltd.; Sony Corp.; PFU Limited, all of Japan

[21] Appl. No.: 985,687

[22] Filed: Dec. 4, 1992

[30] Foreign Application Priority Data

Dec. 4, 1991 [JP]  Japan ................................. 3-320737

[51] Int. Cl.⁶ ............................................. H03M 11/00
[52] U.S. Cl. ........................................ 341/25; 341/26
[58] Field of Search ............... 341/25, 24, 26; 84/615, 84/653, DIG. 7

[56] References Cited

U.S. PATENT DOCUMENTS

| | | | |
|---|---|---|---|
| 4,498,073 | 2/1985 | Fishen et al. | 341/25 |
| 4,918,444 | 4/1990 | Matsubayashi | 341/26 |
| 4,929,944 | 5/1990 | Nakajima | 341/25 |

FOREIGN PATENT DOCUMENTS

58-195239  11/1983  Japan ........................ G06F 3/02

Primary Examiner—James J. Groody
Assistant Examiner—Glenton B. Burgess
Attorney, Agent, or Firm—Staas & Halsey

[57] ABSTRACT

A method differentiates simultaneous and sequential key strokes by detecting simultaneous key strokes if two keys are pushed within a judging time $T_L$. The method includes the steps of (a) measuring a first time $T_1$ from a time when a first key is pushed to a time when a second key is pushed, and a second time $T_2$ from the time when the second key is pushed to a time when one of the first and second keys is released, (b) comparing the first and second times $T_1$ and $T_2$ with an arbitrary threshold function $T_C$ which is set within the judging time $T_L$, and (c) differentiating whether key strokes of the first and second keys are simultaneous or sequential based on a comparison result of the step (b).

37 Claims, 7 Drawing Sheets

METHOD AND APPARATUS FOR DIFFERENTIATING SIMULTANEOUS AND SEQUENTIAL KEY STROKES

BACKGROUND OF THE INVENTION

The present invention generally relates to methods and apparatuses for differentiating simultaneous and sequential key strokes, and more particularly to a method and an apparatus for differentiating simultaneous and sequential key strokes made on an input device when inputting information to a computer or the like.

Conventionally, a single key stroke on a keyboard inputs character, symbol and numeric information to a computer or the like. In addition, in order to minimize the number of keys on the keyboard and enable a larger amount of character, symbol and numeric information to be input from the keyboard, an input is also made by a combination of one key and a control key such as a shift key or a voiced sound key. When making the input by such a key combination, the key stroke of one key and the key stroke of the control key are made simultaneously.

On the other hand, the simultaneous and sequential key strokes are conventionally differentiated in the following manner. That is, it is judged that the key stroke $K_1$ is a part of sequential key strokes when a time $T_L$ elapses from a time when the key $K_1$ is first pushed. Similarly, it is judged that the key stroke $K_2$ is a part of sequential key strokes when a time $T_L$ elapses from a time when the key $K_2$ is first pushed. The time $T_L$ is a fixed parameter used for detecting simultaneous key strokes, and is normally set to 100 msec. On the other hand, it is judged that the key strokes of the keys $K_1$ and $K_2$ are simultaneous if the second key $K_2$ is pushed before the time $T_L$ elapses from the time when the first key $K_1$ is pushed. In other words, the key strokes are judged as being simultaneous if the keys $K_1$ and $K_2$ are pushed within the time $T_L$.

Figure 1:
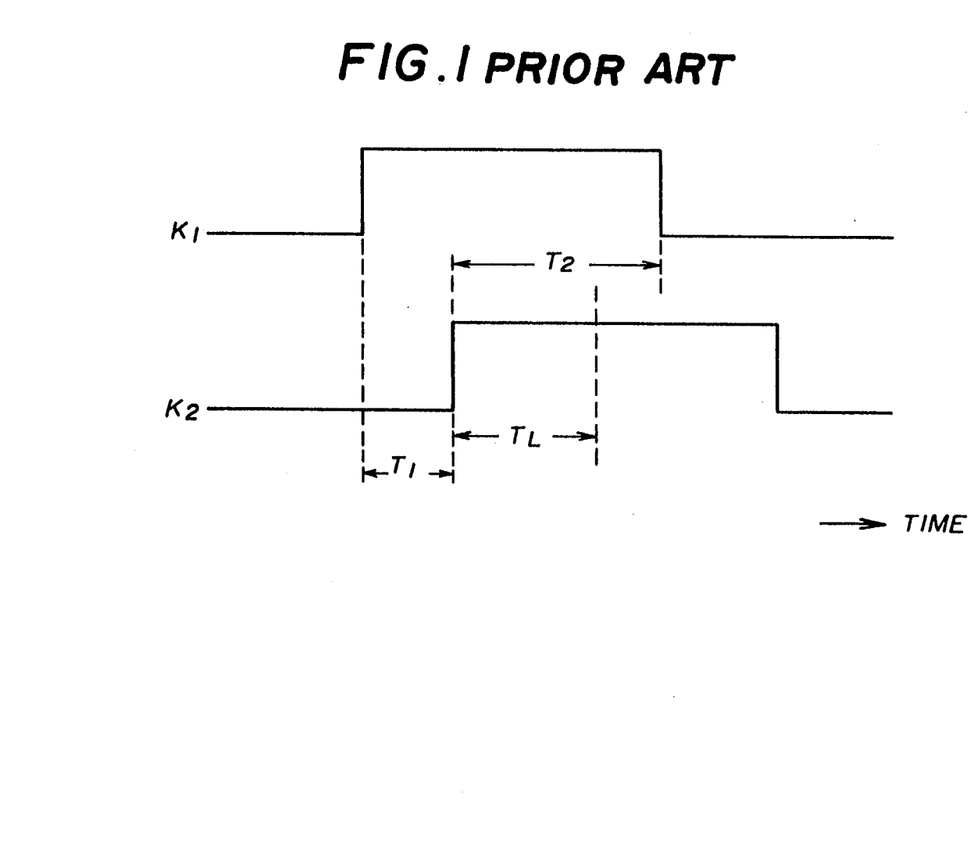
FIG. 1 is a time chart for explaining a conventional method of judging simultaneous key strokes.
Figure 2:
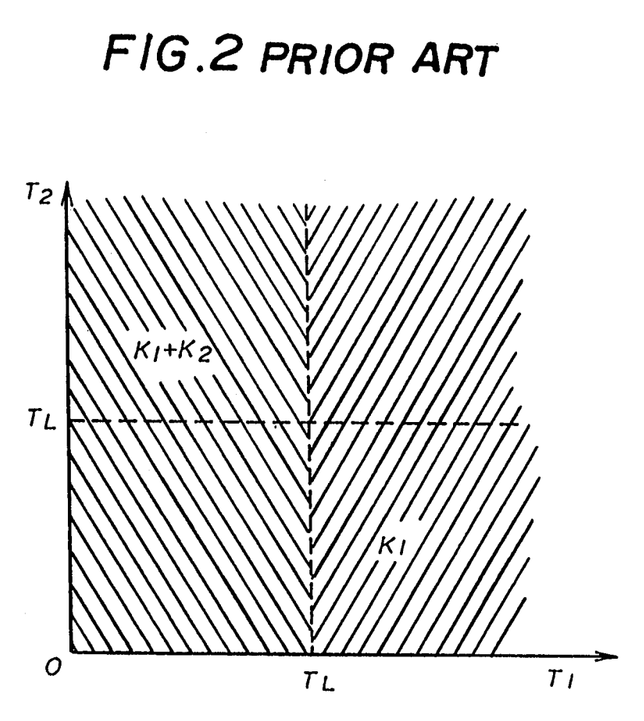
FIG. 2 is a diagram for explaining the conventional operation of differentiating simultaneous and sequential key strokes.

FIGS. 1 and 2 are diagrams for explaining the operation of differentiating the simultaneous and sequential key strokes. As shown in FIG. 2, it is detected that the key stroke $K_1$ is a part of the sequential key strokes if the time $T_L$ elapses from the time when the key $K_1$ is pushed and the key $K_2$ is not pushed during this time $T_L$. The simultaneous key strokes of the keys $K_1$ and $K_2$ are detected if the key $K_2$ is pushed before the time $T_L$ elapses from the time when the key $K_1$ is pushed.

However, as may be seen from FIG. 2, a differentiation of the simultaneous and sequential key strokes is conventionally not made if both times $T_1$ and $T_2$ fall within the time $T_L$, where $T_1$ is the time difference between the time when the key $K_1$ is pushed and the time when the key $K_2$ is pushed, and $T_2$ is the time difference between the time when the key $K_2$ is pushed and the time when the key $K_1$ is released. That is, $T_2$ is the time during which both the keys $K_1$ and $K_2$ are held pushed.

Accordingly, the key strokes are all judged as being simultaneous key strokes if both the times $T_1$ and $T_2$ are shorter than the time $T_L$. In this case, there are problems in that an input error may occur in response to the key strokes which are made, and that the differentiating accuracy of the key strokes is poor.

SUMMARY OF THE INVENTION

Accordingly, it is a general object of the present invention to provide a novel and useful method and an apparatus for differentiating simultaneous and sequential key strokes, in which the problems described above are eliminated.

Another and more specific object of the present invention is to provide a method of differentiating simultaneous and sequential key strokes by detecting simultaneous key strokes if two keys are pushed within a judging time $T_L$, comprising the steps of (a) measuring a first time $T_1$ from a time when a first key is pushed to a time when a second key is pushed, and a second time $T_2$ from the time when the second key is pushed to a time when one of the first and second keys is released, (b) comparing the first and second times $T_1$ and $T_2$ with an arbitrary differentiation function $T_C = f(T_1, T_2)$ which is set within the judging time $T_L$, and (c) differentiating whether key strokes of the first and second keys are simultaneous or sequential based on a comparison result of the step (b). According to the method of the present invention, it is possible to improve the accuracy of the differentiation and prevent erroneous input from an input device.

Still another object of the present invention is to provide an apparatus for differentiating simultaneous and sequential key strokes by detecting simultaneous key strokes if two keys are pushed within a judging time $T_L$, comprising first means for measuring a first time $T_1$ from a time when a first key is pushed to a time when a second key is pushed, and a second time $T_2$ from the time when the second key is pushed to a time when one of the first and second keys is released, second means for comparing the first and second times $T_1$ and $T_2$ with an arbitrary differentiation function $T_C = f(T_1, T_2)$ which is set within the judging time $T_L$, and third means for differentiating whether key strokes of the first and second keys are simultaneous or sequential based on a comparison result obtained from the second means. According to the apparatus of the present invention, it is possible to improve the accuracy of the differentiation and prevent erroneous input from an input device.

Other objects and further features of the present invention will be apparent from the following detailed description when read in conjunction with the accompanying drawings.

DESCRIPTION OF THE PREFERRED EMBODIMENTS

Figure 3:
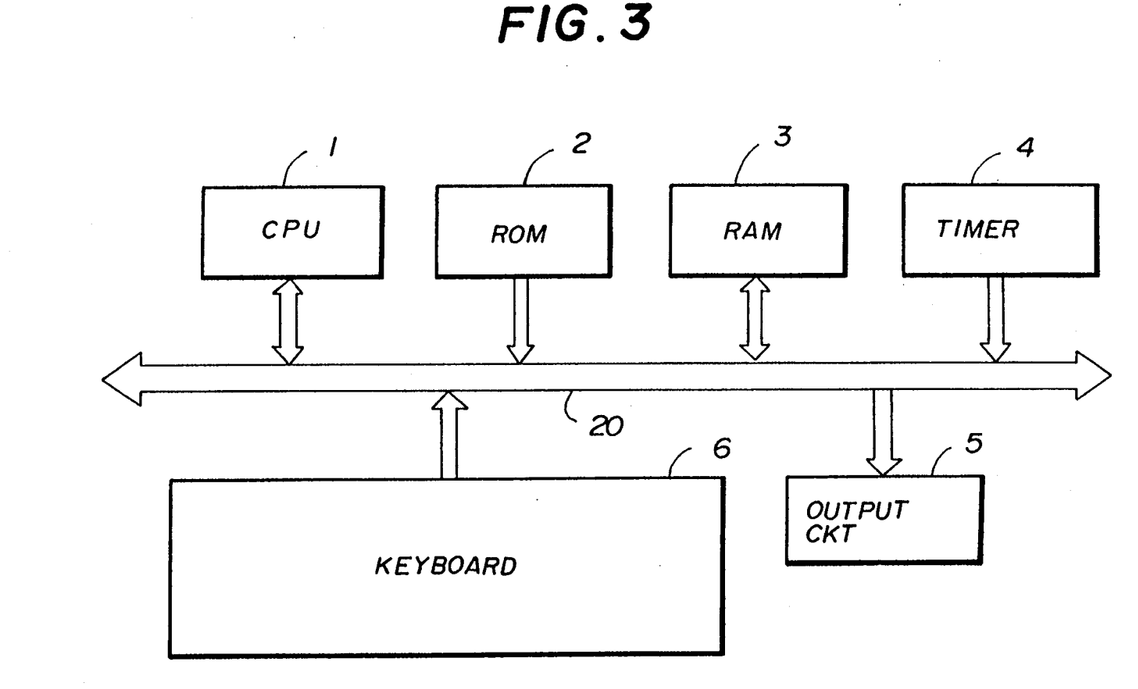
FIG. 3 is a system block diagram showing a keyboard unit which is applied with an embodiment of an apparatus for differentiating simultaneous and sequential key strokes according to the present invention.

A description will be given of an embodiment of an apparatus for differentiating simultaneous and sequential key strokes according to the present invention, by referring to FIGS. 3 and 4. FIG. 3 shows a keyboard unit which is applied with this embodiment of the apparatus, and FIG. 4 shows an essential part of a keyboard of the keyboard unit.

In FIG. 3, the keyboard unit generally includes a central processing unit (CPU) 1, a read only memory (ROM) 2, a random access memory (RAM) 3, a timer 4, an output circuit 5, and a keyboard 6 which are coupled via a bus 20.

The ROM 2 prestores programs for controlling the CPU 1, and codes corresponding to each key and each combination of keys. The programs prestored in the ROM 2 include a differentiating program for differentiating simultaneous and sequential key strokes. Various registers are set in the RAM 3. The timer 4 and the output circuit 5 are used for outputting the codes. The keyboard 6 has a key arrangement shown in FIG. 4.

Figure 4:
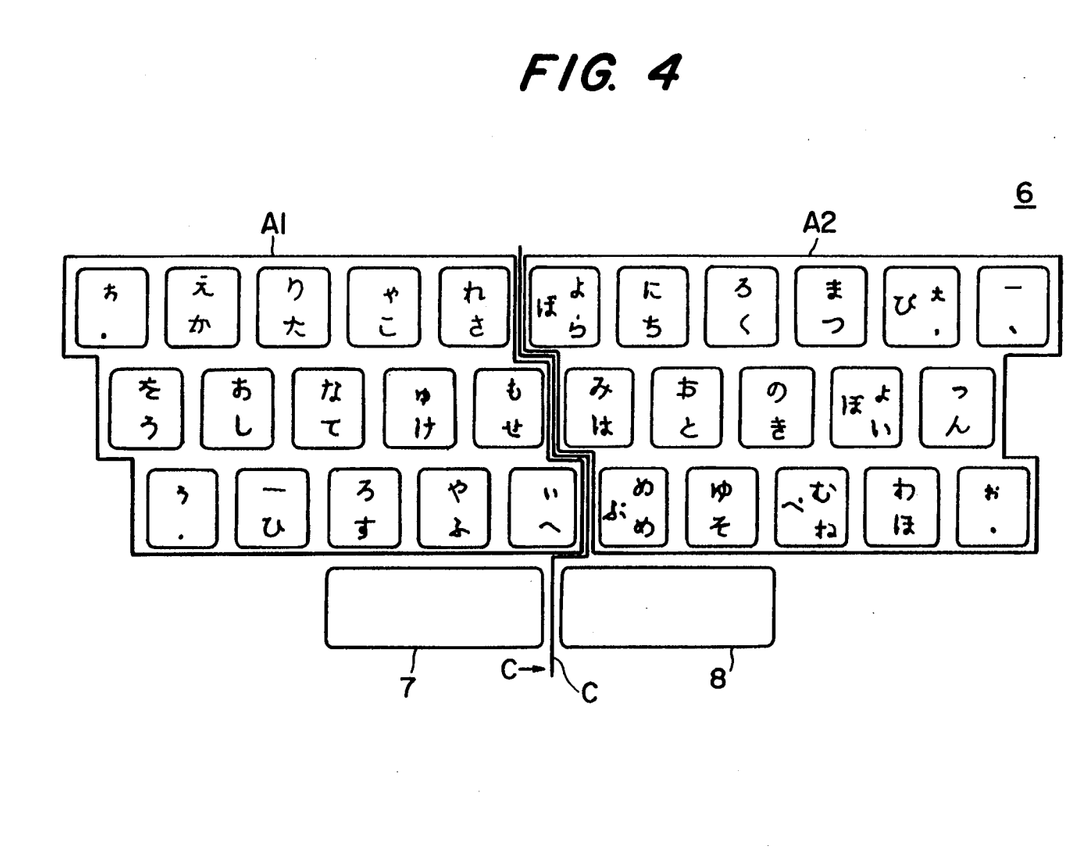
FIG. 4 is a plan view showing an essential part of a keyboard of the apparatus shown in FIG. 3.

In FIG. 4, Japanese character keys, including Japanese hiragana character keys and semi-voiced sound character keys, are arranged in three rows. However, the keyboard 6 may have other key arrangements, and may have alpha-numeric and symbol keys. In FIG. 4, the keys are roughly divided into a group of keys arranged in a left region A1 and a group of keys arranged in a right region A2. A center line C corresponds to a boundary between the regions A1 and A2. A left thumb key (or left control key) 7 is arranged in the region A1 at the fourth bottom row, and a right thumb key (or right control key) 8 is arranged in the region A2 at the fourth bottom row.

The selection of the character, that is, the character input from the keyboard 6, is made in the following manner.

If an arbitrary key in the region A1 or A2 is pushed independently, a character which is indicated on the lower half of this arbitrary key is selected and input.

If an arbitrary key in the region A1 or A2 and one of the thumb keys 7 and 8 in the same region as the arbitrary key are pushed, a character which is indicated on the upper half of this arbitrary key is selected and input.

If an arbitrary key in the region A1 or A2 and one of the thumb keys 7 and 8 in the region different from the arbitrary key are pushed, a voiced sound character of a character which is indicated on the lower half of this arbitrary key is selected and input.

Figure 5:
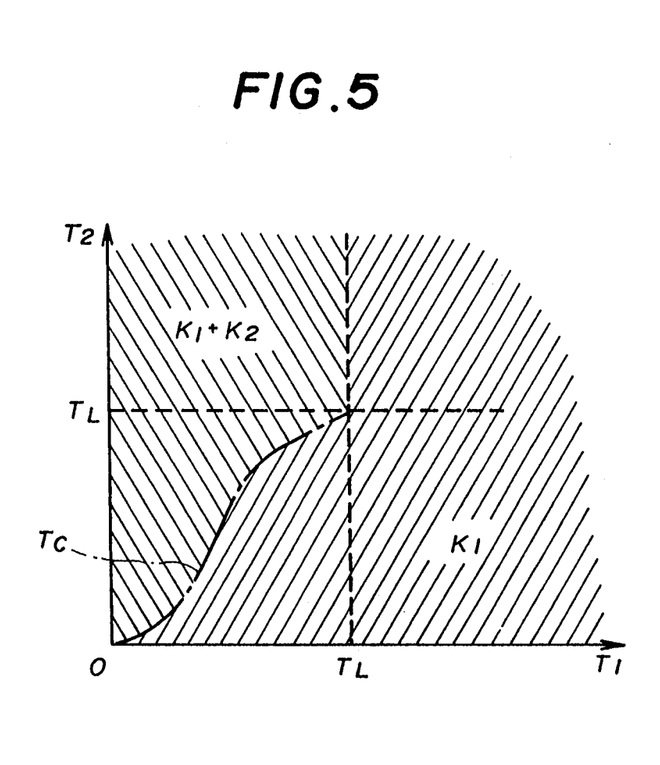
FIG. 5 is a diagram for explaining an embodiment of a method of differentiating simultaneous and sequential key strokes according to the present invention.

Next, a description will be given of the operation of differentiating simultaneous and sequential key strokes in this embodiment of the apparatus, by referring to FIG. 5. FIG. 5 shows an embodiment of a method of differentiating simultaneous and sequential key strokes according to the present invention.

If a key $K_2$ is pushed within a time $T_L$ from the time when a key $K_1$ is pushed and one of the keys $K_1$ and $K_2$ is released within the time $T_L$ from the time when the key $K_2$ is pushed, that is, if the keys $K_1$ and $K_2$ are pushed within a time region which is surrounded by $T_1=T_L$ on the $T_1$ time-axis and $T_2=T_L$ on the $T_2$ time-axis in FIG. 5, the ratio of the times $T_1$ and $T_2$ with respect to a differentiation function (or threshold curve) $T_C=f(T_1, T_2)$ is compared. The time $T_1$ is the time interval between the time when the key $K_1$ is pushed and the time when the key $K_2$ is pushed, and the time $T_2$ is the time interval in which both the keys $K_1$ and $K_2$ are pushed simultaneously, as may be seen from FIG. 1 described above. The time $T_L$ is a fixed parameter for detecting simultaneous key strokes, and the simultaneous key strokes are detected if the keys $K_1$ and $K_2$ are pushed within the time $T_L$. The differentiation function $T_C$ is set within the above time region. The differentiation as to whether a single key was pushed (that is, a part of sequential key strokes) or two keys were pushed simultaneously (that is, simultaneous key strokes) is made based on the result of the comparison. For example, the key $K_1$ is a character key and the key $K_2$ is a thumb key (control key).

The methods of detecting whether or not each key is pushed and detecting whether or not each key is released, are known. Accordingly, a description related to the detecting methods will be omitted in the present specification.

A part of sequential key strokes is detected if the times $T_1$ and $T_2$ fall below the differentiation function $T_C$ in FIG. 5. On the other hand, simultaneous key strokes are detected if the the times $T_1$ and $T_2$ fall above the differentiation function $T_C$ in FIG. 5. Accordingly, by setting the differentiation function $T_C$ within the time $T_L$ which is the fixed parameter for judging the simultaneous key strokes, and judging whether the key stroke is a part of sequential key strokes or the key strokes are simultaneous based on the differentiation function $T_C$, it is possible to prevent an erroneous input from the keyboard 6 even if the keys are pushed within the time $T_L$. Further, since a reference is made to the times $T_1$ and $T_2$ when making the differentiation, it is possible to judge that the key stroke is a part of sequential key strokes even if the time $T_1$ is relatively short as long as the time $T_2$ is shorter than the time $T_1$. As a result, it is possible to prevent an erroneous differentiation even if an operator of the keyboard 6 makes quick key strokes.

Figure 6:
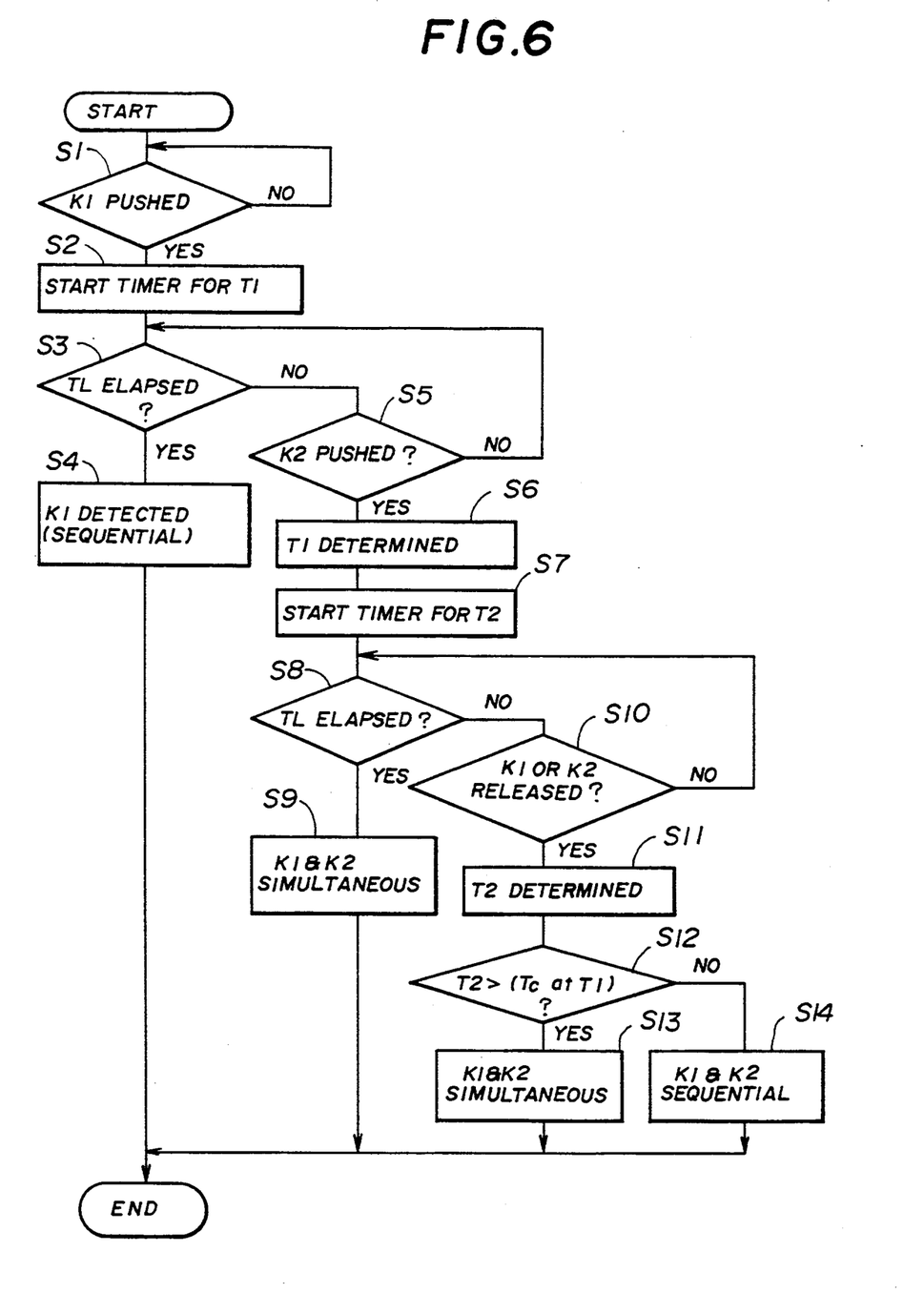
FIG. 6 is a flow chart for explaining the embodiment of the method.

FIG. 6 is a flow chart for explaining the operation of this embodiment of the method. The operation shown in FIG. 6 corresponds to the operation of the CPU 1 shown in FIG. 3.

In FIG. 6, a step S1 decides whether or not the key $K_1$ is pushed. This step S1 is repeated until the decision result in the step S1 becomes YES. When the decision result in the step S1 becomes YES, a step S2 starts an internal timer of the CPU 1 or the timer 4 for timing the time $T_1$. Then, a step S3 decides whether or not the time $T_L$ has elapsed. If the decision result in the step S3 is YES, a step S4 detects that the key stroke of the key $K_1$ is a part of sequential key strokes and the process is ended.

On the other hand, if the decision result in the step S3 is NO, a step S5 decides whether or not the key $K_2$ is pushed. The process returns to the step S3 if the decision result in the step S5 is NO. But if the decision result in the step S5 is YES, a step S6 determines the time $T_1$ by temporarily storing the time $T_1$ in the RAM 3, for example. In addition, a step S7 starts an internal timer of the CPU 1 or the timer 4 for timing the time $T_2$.

Next, a step S8 decides whether or not the time $T_L$ has elapsed. If the decision result in the step S8 is YES, a step S9 detects that the key strokes of the keys $K_1$ and $K_2$ are simultaneous, and the process is ended.

On the other hand, if the decision result in the step S8 is NO, a step S10 decides whether or not the key $K_1$ or the key $K_2$ is released. The process returns to the step S8 if the decision result in the step S10 is NO. But if the decision result in the step S10 is YES, a step S11 determines the time $T_2$ by temporarily storing the time $T_2$ in the RAM 3, for example.

Of course, the step S10 may decide whether or not both the keys $K_1$ and $K_2$ are released. The step S10 may also decide whether the key $K_1$ alone is released, the key $K_2$ alone is released, or both the keys $K_1$ and $K_2$ are released.

After the step S11, a step S12 decides whether or not the time $T_2$ is greater than the differentiation function $T_C = f(T_1, T_2)$ at $T_1$. If the decision result in the step S12 is YES, a step S13 detects the key strokes of the keys $K_1$ and $K_2$ as being simultaneous, and the process ends. On the other hand, if the decision result in the step S12 is NO, a step S14 detects the key strokes of the keys $K_1$ and $K_2$ as being sequential, and the process ends.

Next, a description will be given of another embodiment of the apparatus for differentiating simultaneous and sequential key strokes according to the present invention, by referring to FIG. 7. In this embodiment of the apparatus, the present invention is also applied to a keyboard unit, and FIG. 7 shows an essential part of the keyboard unit.

Figure 7:
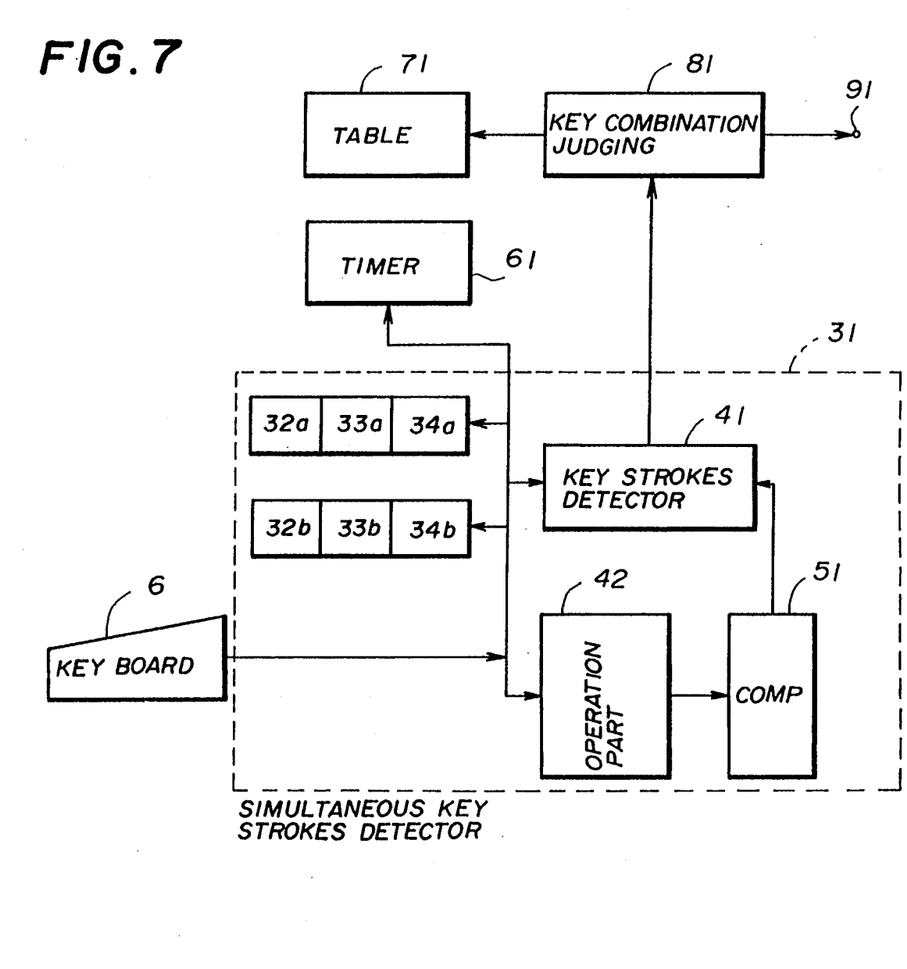
FIG. 7 is a system block diagram showing an essential part of another embodiment of the apparatus for differentiating simultaneous and sequential key strokes according to the present invention.

The keyboard unit shown in FIG. 7 includes a keyboard 6, a simultaneous key strokes detector 31, a timer 61, a code combination table 71, and a key combination judging part 81 which are connected as shown. The simultaneous key strokes detector 31 and the key combination judging part 81 function as the CPU 1 of the embodiment shown in FIG. 3.

The simultaneous key strokes detector 31 includes memories 32a and 32b for storing key codes, memories 33a and 33b for storing times, memories 34a and 34b for storing key release (key OFF) times, a key stroke detector 41, an operation part 42, and a comparator 51 which are connected as shown.

When a key of the keyboard 6 is pushed, the key stroke detector 41 stores a key code of this pushed key into the memory 32a, and stores a key-ON time which is read from the timer 61 into the memory 33a. The key-ON time is the time when the key is pushed. When the pushed key is released, the key stroke detector 41 reads the key code of this released key from the memory 32a and supplies this key code to the key combination judging part 81. If the key code has a meaning by itself, the key combination judging part 81 outputs a character code corresponding to the key code via an output terminal 91. On the other hand, if the key code does not have a meaning by itself, the key combination judging part 81 disregards the received key code.

If a first key is pushed and a second key such as a control key is pushed before the first key is released, the key stroke detector 41 stores the key code of the second key into the memory 32b, and stores a key-ON time of the second key which is read from the timer 61 into the memory 33b.

If the first and second keys are released one after the other, the key stroke detector 41 supplies the key codes of the first and second keys stored in the memories 32a and 32b to the key combination judging part 81. The key combination judging part 81 refers to the key code combination table 71 and judges whether or not the combination of the keys codes of the first and second keys is valid. If the key code combination is valid, the key combination judging part 81 outputs a character code which is described by this key code combination via the output terminal 91. On the other hand, if the key code combination is invalid, the key combination judging part 81 disregards the received key codes of the first and second keys.

Furthermore, the key stroke detector 41 reads a key-OFF time of the first key from the timer 61 and stores this key-OFF time into the memory 34a. Similarly, the key stroke detector 41 reads a key-OFF time of the second key from the timer 61 and stores this key-OFF time into the memory 34b. The key-OFF time is the time when the pushed key is released.

The operation part 42 refers to the memories 33a and 33b to calculate the time $T_1$ from the key-ON times of the first and second keys. In addition, the operation part 42 refers to the memories 33b, 34a and 34b to calculate the time $T_2$ based on the key-ON time of the second key and the key-OFF times of the first and second keys.

The comparator 51 compares the coordinate of the times $T_1$ and $T_2$ with respect to the threshold curve $T_C$, so as to differentiate whether the key stroke is a part of sequential key strokes or the key strokes are simultaneous. The differentiation result of the comparator 51 is notified to the key stroke detector 41.

The key stroke detector 41 reads the key codes of the first and second keys from the memories 32a and 32b and supplies these key codes to the key combination judging part 81 if the differentiation result from the comparator 51 indicates that the key strokes are simultaneous. On the other hand, the key stroke detector 41 reads the key code of the first key from the memory 32a and supplies this key code to the key combination judging part 81 if the differentiation result from the comparator 51 indicates that the key stroke is a part of sequential key strokes.

The differentiation function $T_C$ is of course not limited to that of the embodiment shown in FIG. 5, and an arbitrary differentiation function $T_C$ may be used. In addition, it is also possible to vary the differentiation function $T_C$ with the key input time. In this case, it is possible to vary the differentiation function $T_C$ in correspondence with the change in the key input speed due to fatigue.

Furthermore, in the described embodiments, the simultaneous or sequential key strokes of the two keys $K_1$ and $K_2$ are detected. However, it is of course possible to similarly detect simultaneous or sequential key strokes of three or more keys.

In addition, the present invention is applied to the keyboard unit in the described embodiments, but may be applied to other apparatuses which is responsive to an input made from an input device having a plurality of input keys or switches. For example, the present invention is applicable to electronic instruments such as an electronic piano.

Further, the present invention is not limited to these embodiments, but various variations and modifications may be made without departing from the scope of the present invention.

What is claimed is:

1. A method of differentiating simultaneous and sequential key strokes between a first key and a second key, the first key being pushed before the second key, by using a judging time $T_L$ and an arbitrary differentiation function $T_C$ defining a curve which is represented by a graph having an origin point, a first axis indicating a first time $T_1$ equal to the time difference between the time when the first key is pushed and the time when the second key is pushed, and a second axis indicating a second time $T_2$ during which both the first key and the second key are simultaneously held pushed, the first axis and the second axis intersecting at the origin point, the differentiation function $T_C$ graphically existing in an intersection portion of the graph along the first axis from the origin point to the judging time $T_L$ and along the second axis from the origin point to the judging time $T_L$, said method comprising the steps of:
(a) measuring the first time $T_1$ and the second time $T_2$;
(b) comparing the first time $T_1$ and the second time $T_2$ with the differentiation function $T_C$ to determine a comparison result; and
(c) differentiating whether key strokes of the first key and the second key are simultaneously or sequential based on the comparison result of said comparing step.

2. The method of differentiating simultaneous and sequential key strokes as claimed in claim 1, wherein said differentiating step differentiates that the key strokes of the first key and the second key are simultaneous if the first and second times $T_1$ and $T_2$ fall above the curve defined by the differentiation function $T_C$, and that the key strokes of the first and second keys are sequential if the first and second times $T_1$ and $T_2$ fall below the curve defined by the differentiation function $T_C$.

3. The method of differentiating simultaneous and sequential key strokes as claimed in claim 1, wherein the differentiation function $T_C$ is variable.

4. The method of differentiating simultaneous and sequential key strokes as claimed in claim 1, wherein said differentiating step differentiates that the key strokes of the first key and the second key are sequential even if the first time $T_1$ is shorter than the judging time $T_L$ as long as the second time $T_2$ is shorter than the first time $T_1$.

5. The method of differentiating simultaneous and sequential key strokes as claimed in claim 1, wherein the first key and the second key are provided on a keyboard of a keyboard unit.

6. The method of differentiating simultaneous and sequential key strokes as claimed in claim 1, wherein the first and second times $T_1$ and $T_2$ are shorter than the judging time $T_L$.

7. An apparatus for differentiating simultaneous and sequential key strokes between a first key and a second key, the first key being pushed before the second key, which uses a judging time $T_L$ and an arbitrary differentiation function $T_C$ defining a curve which is represented by a graph having an origin point, a first axis indicating a first time $T_1$ equal to the time difference between the time when the first key is pushed and the time when the second key is pushed, and a second axis indicating a second time $T_2$ during which both the first key and the second key are simultaneously held pushed, the first axis and the second axis intersecting at the origin point, the differentiation function $T_C$ graphically existing in an intersection portion of the graph along the first axis from the origin point to the judging time $T_L$ and along the second axis from the origin point to the judging time $T_L$, said apparatus comprising:
first means for measuring the first time $T_1$ and the second time $T_2$;
second means for comparing the first time $T_1$ and the second time $T_2$ with the differentiation function $T_C$ to determine the comparison result; and
third means, responsive to the comparison result of the second means, for differentiating whether key strokes of the first key and the second key are simultaneous or sequential.

8. The apparatus for differentiating simultaneous and sequential key strokes as claimed in claim 7, wherein said third means differentiates that the key strokes of the first key and the second key are simultaneous if the first and second times $T_1$ and $T_2$ fall above a curve defined by the differentiation function $T_C$, and that the key strokes of the first key and the second key are sequential if the first and second times $T_1$ and $T_2$ fall below the curve defined by the differentiation function $T_C$.

9. The apparatus for differentiating simultaneous and sequential key strokes as claimed in claim 7, wherein the differentiation function $T_C$ is variable.

10. The apparatus for differentiating simultaneous and sequential key strokes as claimed in claim 7, wherein said third means differentiates that the key strokes of the first key and the second key are sequential even if the first time $T_1$ is shorter than the judging time $T_L$ as long as the second time $T_2$ is shorter than the first time $T_1$.

11. The apparatus for differentiating simultaneous and sequential key strokes as claimed in claim 7, wherein the first key and the second key are provided on a keyboard of a keyboard unit.

12. The apparatus for differentiating simultaneous and sequential key strokes as claimed in claim 7, wherein the first and second times $T_1$ and $T_2$ are shorter than the judging time $T_L$.

13. The apparatus for differentiating simultaneous and sequential key strokes as claimed in claim 7, wherein said first means comprises:
detecting means for detecting when the first key pushed and released and for detecting when the second key is pushed and released;
a timer which determines the time at which the first key is pushed and released, as detected by said detecting means, and which determines the time at which the second key is pushed and released, as detected by the detecting means;
storing means for storing an ON time when each key is pushed and an OFF time when each pushed key is released, based on the times determined by said timer; and
operation means for calculating the first and second times $T_1$ and $T_2$ based on the ON and OFF times stored in said storing means.

14. The method of differentiating simultaneous and sequential key strokes as claimed in claim 2, wherein the differentiation function $T_C$ is variable.

15. The method of differentiating simultaneous and sequential key strokes as claimed in claim 2, wherein said differentiating step differentiates that the key strokes of the first key and the second key are sequential even if the first time $T_1$ is shorter than the judging time $T_L$ as long as the second time $T_2$ is shorter than the first time $T_1$.

16. The method of differentiating simultaneous and sequential key strokes as claimed in claim 2, wherein the first key and the second key are provided on a keyboard of a keyboard unit.

17. The method of differentiating simultaneous and sequential key strokes as claimed in claim 2, wherein the first and second times $T_1$ and $T_2$ are shorter than the judging time $T_L$.

18. The apparatus for differentiating simultaneous and sequential key strokes as claimed in claim 8, wherein the differentiation function $T_C$ is variable.

19. The apparatus for differentiating simultaneous and sequential key strokes as claimed in claim 8, wherein said third means differentiates that the key strokes of the first key and the second key are sequential even if the first time $T_1$ is shorter than the judging time $T_L$ as long as the second time $T_2$ is shorter than the first time $T_1$.

20. The apparatus for differentiating simultaneous and sequential key strokes as claimed in claim 8, wherein the first key and the second key are provided on a keyboard of a keyboard unit.

21. The apparatus for differentiating simultaneous and sequential key strokes as claimed in claim 8, wherein the first and second times $T_1$ and $T_2$ are shorter than the judging time $T_L$.

22. The apparatus for differentiating simultaneous and sequential key strokes as claimed in claim 8, wherein said first means comprises:
   detecting means for detecting when the first key is pushed and released and for detecting when the second key is pushed and released;
   a timer which determines the time at which the first key is pushed and released, as detected by said detecting means, and which determines the time at which the second key is pushed and released, as detected by the detecting means;
   storing means for storing an ON time when each key is pushed and an OFF time when each pushed key is released, based on the times determined by said timer; and
   operation means for calculating the first and second times $T_1$ and $T_2$ based on the ON and OFF times stored in said storing means.

23. A method of differentiating simultaneous and sequential key strokes by detecting simultaneous key strokes if two keys are pushed within a judging time $T_L$, said method comprising the steps of:
   (a) measuring a first time $T_1$ equal to the time difference between the time when a first key is pushed and the time when a second key is pushed, and a second time $T_2$ equal to the time when both the first key and the second key are simultaneously held pushed;
   (b) comparing the first time $T_1$ and the second time $T_2$ with an arbitrary differentiation function $T_C$ which is set within the judging time $T_L$, to determine a comparison result; and
   (c) differentiating whether key strokes of the first key and the second key are simultaneously or sequential based on the comparison result of said comparing step, the key strokes of the first key and the second key differentiated to be simultaneous if the first and second times $T_1$ and $T_2$ fall above a curve defined by the differentiation function $T_C$, and the key strokes of the first key and the second key differentiated to be sequential if the first and second times $T_1$ and $T_2$ fall below the curve defined by the differentiation function $T_C$.

24. The method of differentiating simultaneous and sequential key strokes as claimed in claim 23, wherein the differentiation function $T_C$ is variable.

25. The method of differentiating simultaneous and sequential key strokes as claimed in claim 23, wherein said differentiating step differentiates that the key strokes of the first key and the second key are sequential even if the first time $T_1$ is shorter than the judging time $T_L$ as long as the second time $T_2$ is shorter than the first time $T_1$.

26. The method of differentiating simultaneous and sequential key strokes as claimed in claim 23, wherein the first key and the second key are provided on a keyboard of a keyboard unit.

27. The method of differentiating simultaneous and sequential key strokes as claimed in claim 23, wherein the first and second times $T_1$ and $T_2$ are shorter than the judging time $T_L$.

28. An apparatus for differentiating simultaneous and sequential key strokes by detecting simultaneous key strokes if two keys are pushed within a judging time $T_L$, said apparatus comprising:
   first means for measuring a first time $T_1$ equal to the time difference between the time when a first key is pushed and the time when a second key is pushed, and a second time $T_2$ equal to a time during which both the first key and the second key are simultaneously held pushed;
   second means for comparing the first time $T_1$ and the second time $T_2$ with an arbitrary differentiation function $T_C$ which is set within the judging time $T_L$, to determine the comparison result; and
   third means, responsive to the comparison result of the second means, for differentiating whether key strokes of the first key and the second key are simultaneous or sequential, said third means differentiating that the key strokes of the first key and the second key are simultaneous if the first and second times $T_1$ and $T_2$ fall above a curve defined by the differentiation function $T_C$, and that the key strokes of the first key and the second key are sequential if the first and second times $T_1$ and $T_2$ fall below the curve defined by the differentiation function $T_C$.

29. The apparatus for differentiating simultaneous and sequential key strokes as claimed in claim 28, wherein the differentiation function $T_C$ is variable.

30. The apparatus for differentiating simultaneous and sequential key strokes as claimed in claim 28, wherein said third means differentiates that the key strokes of the first key and the second key are sequential even if the first time $T_1$ is shorter than the judging time $T_L$ as long as the second time $T_2$ is shorter than the first time $T_1$.

31. The apparatus for differentiating simultaneous and sequential key strokes as claimed in claim 28, wherein the first key and the second key are provided on a keyboard of a keyboard unit.

32. The apparatus for differentiating simultaneous and sequential key strokes as claimed in claim 28, wherein the first and second times $T_1$ and $T_2$ are shorter than the judging time $T_L$.

33. The apparatus for differentiating simultaneous and sequential key strokes as claimed in claim 28, wherein said first means comprises:
   detecting means for detecting when the first key is pushed and released and for detecting when the second key is pushed and released;
   a timer which determines the time at which the first key is pushed and released, as detected by said detecting means, and which determines the time at which the second key is pushed and released, as detected by the detecting means;
   storing means for storing an ON time when each key is pushed and an OFF time when each pushed key is released, based on the times determined by said timer; and operation means for calculating the first and second times $T_1$ and $T_2$ based on the ON and OFF times stored in said storing means.

34. A method of differentiating simultaneous and sequential key strokes between a first key and a second key, the first key being pushed before the second key, by using a judging time $T_L$ and an arbitrary differentiation function $T_C$ which is set within the judging time $T_L$, said method comprising the steps of:

(a) measuring a first time $T_1$ equal to the time difference between the time when the first key is pushed and the time when the second key is pushed, and a second time $T_2$ equal to the time during which both the first key and the second key are simultaneously held pushed;

(b) comparing the first time $T_1$ and the second time $T_2$ with the differentiation function $T_C$ to determine a comparison result; and (c) differentiating whether key strokes of the first key and the second key are simultaneously or sequential based on the comparison result of said comparing step, the key strokes of the first key and the second key being differentiated as sequential even if the first time $T_1$ is shorter than the judging time $T_L$ as long as the second time $T_2$ is shorter than the first time $T_1$.

35. A method of differentiating simultaneous and sequential key strokes by detecting simultaneous key strokes if two keys are pushed within a judging time $T_L$, said method comprising the steps of:

(a) measuring a first time $T_1$ equal to the time difference between the time when a first key is pushed and the time when a second key is pushed, and a second time $T_2$ equal to a time during which both the first key and the second key are simultaneously held pushed, the first time $T_1$ and the second time $T_2$ being shorter than the judging time $T_L$;

(b) comparing the first time $T_1$ and the second time $T_2$ with an arbitrary differentiation function $T_C$ which is set within the judging time $T_L$, to determine a comparison result; and (c) differentiating whether key strokes of the first key and the second key are simultaneously or sequential based on the comparison result of said comparing step.

36. An apparatus for differentiating simultaneous and sequential key strokes by detecting simultaneous key strokes if two keys are pushed within a judging time $T_L$, said apparatus comprising:

first means for measuring a first time $T_1$ equal to the time difference between the time when a first key is pushed and the time when a second key is pushed, and a second time $T_2$ equal to a time during which both the first key and the second key are simultaneously held pushed;

second means for comparing the first time $T_1$ and the second time $T_2$ with an arbitrary differentiation function $T_C$ which is set within the judging time $T_L$, to determine the comparison result; and third means, responsive to the comparison result of the second means, for differentiating whether key strokes of the first key and the second key are simultaneous or sequential, said third means differentiating that the key strokes of the first key and the second key are sequential even if the first time $T_1$ is shorter than the judging time $T_L$ as long as the second time $T_2$ is shorter than the first time $T_1$.

37. An apparatus for differentiating simultaneous and sequential key strokes by detecting simultaneous key strokes if two keys are pushed within a judging time $T_L$, said apparatus comprising:

first means for measuring a first time $T_1$ equal to the time difference between the time when a first key is pushed and the time when a second key is pushed, and a second time $T_2$ equal to a time during which both the first key and the second key are simultaneously held pushed, the first and second times $T_1$ and $T_2$ being shorter than the judging time $T_L$;

second means for comparing the first time $T_1$ and the second time $T_2$ with an arbitrary differentiation function $T_C$ which is set within the judging time $T_L$, to determine the comparison result; and third means, responsive to the comparison result of the second means, for differentiating whether key strokes of the first key and the second key are simultaneous or sequential.

* * * * *